(12) United States Patent
Chaparala et al.

(10) Patent No.: US 8,391,330 B2
(45) Date of Patent: Mar. 5, 2013

(54) FRACTURE RESISTANT METALLIZATION PATTERN FOR SEMICONDUCTOR LASERS

(75) Inventors: Satish Chandra Chaparala, Painted Post, NY (US); Martin Hai Hu, Painted Post, NY (US); Lawrence Charles Hughes, Jr., Corning, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 213 days.

(21) Appl. No.: 12/426,563

(22) Filed: Apr. 20, 2009

(65) Prior Publication Data

US 2010/0265982 A1 Oct. 21, 2010

(51) Int. Cl.
*H01S 3/097* (2006.01)

(52) U.S. Cl. ............... 372/87; 372/44.011; 372/50.1

(58) Field of Classification Search .......... 372/44.011, 372/50.1, 87
See application file for complete search history.

(56) References Cited

U.S. PATENT DOCUMENTS

| | | | |
|---|---|---|---|
| 5,119,393 A | 6/1992 | Oka et al. | |
| 5,855,063 A | 1/1999 | Schreiber et al. | |
| 6,330,265 B1 | 12/2001 | Kinoshita | |
| 6,456,641 B1 * | 9/2002 | Hauer et al. | 372/50.1 |
| 6,618,420 B1 | 9/2003 | Gen-Ei et al. | |
| 6,853,665 B2 | 2/2005 | Franke | |
| 6,922,509 B2 | 7/2005 | Hamada | |
| 7,061,962 B2 | 6/2006 | Reithmaier et al. | |
| 7,085,440 B2 | 8/2006 | Kimura et al. | |
| 7,322,704 B2 | 1/2008 | Shchegrov | |
| 7,342,950 B1 | 3/2008 | Mason et al. | |
| 2003/0174961 A1 * | 9/2003 | Hamada | 385/48 |
| 2004/0084779 A1 | 5/2004 | Huang et al. | |
| 2007/0165685 A1 * | 7/2007 | Mizuuchi et al. | 372/87 |
| 2008/0291957 A1 | 11/2008 | Arimoto et al. | |
| 2009/0086775 A1 * | 4/2009 | Hu et al. | 372/21 |

* cited by examiner

*Primary Examiner* — Yuanda Zhang
(74) *Attorney, Agent, or Firm* — Gregory V. Bean

(57) ABSTRACT

Metallization patterns are provided to reduce the probability of chip fracture in semiconductor lasers. According to one embodiment disclosed herein, the pad edges of a metallization pattern extend across a plurality of crystallographic planes in the laser substrate. In this manner, cracks initiated at any given stress concentration would need to propagate across many crystallographic planes in the substrate to reach a significant size. Additional embodiments of the present disclosure relate to the respective geometries and orientations of adjacent pairs of contact pads. Still further embodiments are disclosed and claimed.

20 Claims, 2 Drawing Sheets

US 8,391,330 B2

FRACTURE RESISTANT METALLIZATION PATTERN FOR SEMICONDUCTOR LASERS

BACKGROUND

The present disclosure relates to semiconductor lasers including, but not limited to, infrared or near-infrared distributed feedback (DFB) lasers, distributed Bragg reflector (DBR) lasers, Fabry-Perot lasers, etc. The present disclosure also relates to frequency-converted laser sources incorporating such lasers. More particularly, the present disclosure relates to fracture resistant metallization patterns for semiconductor lasers.

BRIEF SUMMARY

Although the various concepts of the present disclosure are not limited to lasers that operate in any particular part of the optical spectrum, reference is frequently made herein to frequency doubled green lasers, a schematic illustration of which is illustrated in FIG. 6. In FIG. 6, the frequency-converted laser source 100 comprises a laser diode 110, a wavelength conversion device 120, coupling optics 130, collimating optics 140, and an output color filter 150. In the illustrated embodiment, the output of a laser diode 110, which may be IR light, is coupled to the wavelength conversion device 120, which may be a periodically poled MgO-doped lithium niobate SHG crystal or some other type of second or higher order harmonic wavelength conversion device, using the coupling optics 130, which may comprise two aspheric lenses. Green light generated in the SHG crystal and residual IR pump light are collimated by the collimating optics 140 and residual IR light is eliminated by the color filter 150.

Semiconductor lasers according to the present disclosure are equipped with metallization patterns to facilitate proper control of the laser diode. For example, in the context of a frequency-converted laser source 100, particular metallization patterns are provided to provide means by which the emission wavelength of the laser diode 110 can be tuned to stay within the conversion bandwidth of the wavelength conversion device 120 during operation. Metallization patterns can also be provided for controlling the intensity or modulation rate of the laser diode 110. Different portions of the metallization pattern can be dedicated to the control of different portions of the laser diode. Although the present disclosure is not limited to any particular type of control mechanism, conventional laser designs employ metal contact pads for current injection, thermal control, or both. The present disclosure also contemplates applicability for yet-to-be developed uses for metallization patterns in semiconductor lasers.

The fabrication of a semiconductor laser chip is complex and usually involves many process steps, including material growth, etching, metal deposition and polishing. After a laser chip is made, the chip, which is usually made of a brittle material such as semiconductor material systems based on GaAs, InP, GaP, GaN, GaSb, InAs, InN, InSb, or AlN, is mounted on a carrier. The carrier, which may be fabricated from AlN or any other suitable carrier material, provides needed functionality, i.e., electrical connections, mechanisms for heat dissipation, mechanical support, etc. This type of package, which is often referred to as a chip on hybrid (COH) device, is often an important component of wavelength converted laser sources, such as synthetic green lasers. COH devices are often characterized by significant rates of chip fracture, most often after the COH devices are exposed to temperature variations, which could be relatively low temperature cycling from −40 to 80 Celsius or relatively high temperature variations such as those encountered during soldering operations. The variation in the temperature during soldering operations could be from 300 C to room temperature.

The present inventors have recognized that chip fracture most commonly occurs near the boundaries of the metallization pads formed on the top surface of the semiconductor laser chip. Further careful inspection has revealed that theses fractures commonly start at the chip surface, near a metallization pad, and propagate through the cross-sectional plane of the semiconductor laser chip. Finite element simulation shows that tensile stress is created along the semiconductor chip after it is mounted on a carrier. It must be noted that magnitude and the nature (tensile or compressive) stress in the chip depends on the material properties of carrier on which the laser diode chip is attached to and the direction of temperature loading (heating or cooling). The critical material property that determines the nature of stress is coefficient of thermal expansion of laser diode chip and the carrier and the elastic modulus of both materials play a role in determining the magnitude of the stress. In addition, the nature of stress changes depending on whether the entire structure is being heated or cooled. For instance, during laser operation, the entire structure will be heated and during soldering operation, the entire structure will be cooled. If these stress concentration lines run generally parallel to a crystal plane of the laser chip fractures can easily propagate through the cross-section of the laser chip as the level of stress increases during temperature cycling.

In accordance with the embodiments of the present disclosure, metallization patterns are provided to reduce the probability of chip fracture in semiconductor lasers. According to one embodiment disclosed herein, the pad edges of a metallization pattern extend across a plurality of crystallographic planes in the laser substrate. In this manner, cracks initiated at any given stress concentration would need to propagate across many crystallographic planes in the substrate to reach a significant size.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
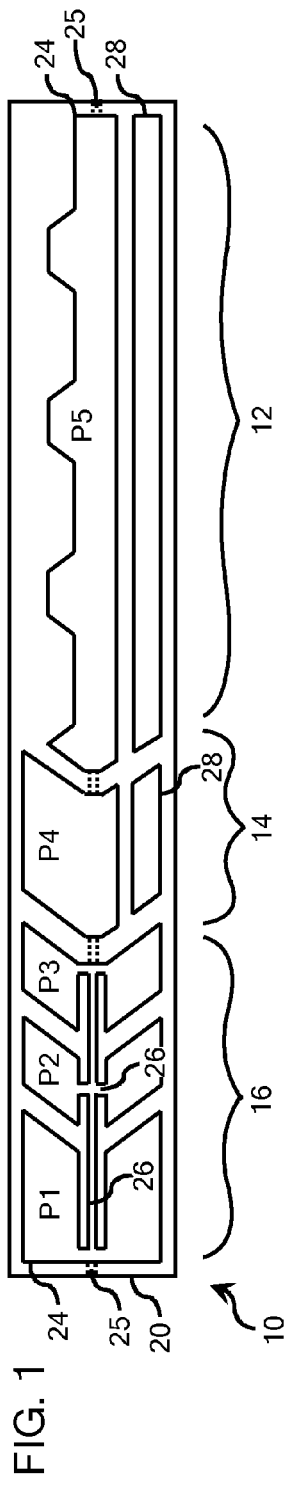
FIG. 1 is a schematic plan view of a fracture resistant metallization pattern for a DBR laser diode.
Figure 2:
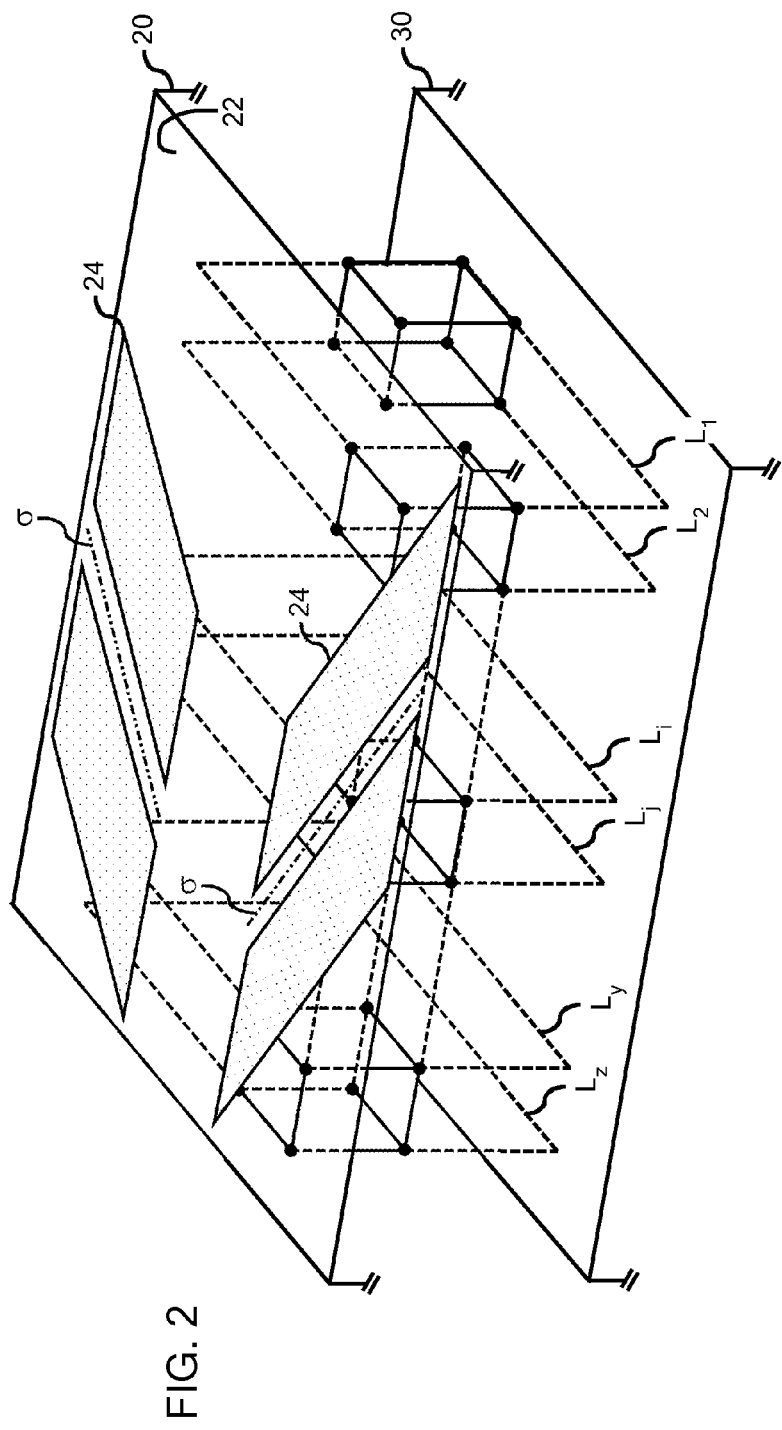
FIG. 2 is a schematic illustration of the manner in which a metallization pattern can be oriented relative to the lattice planes of a laser chip.
Figure 3:
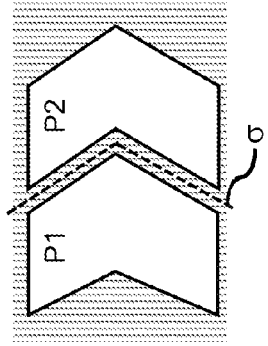
FIGS. 3-5 illustrate some of the contemplated adjacent contact configurations according to the present disclosure.
Figure 4:
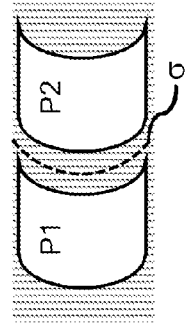
Figure 5:
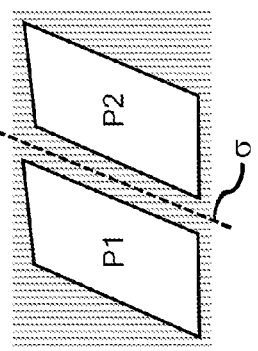
Figure 6:
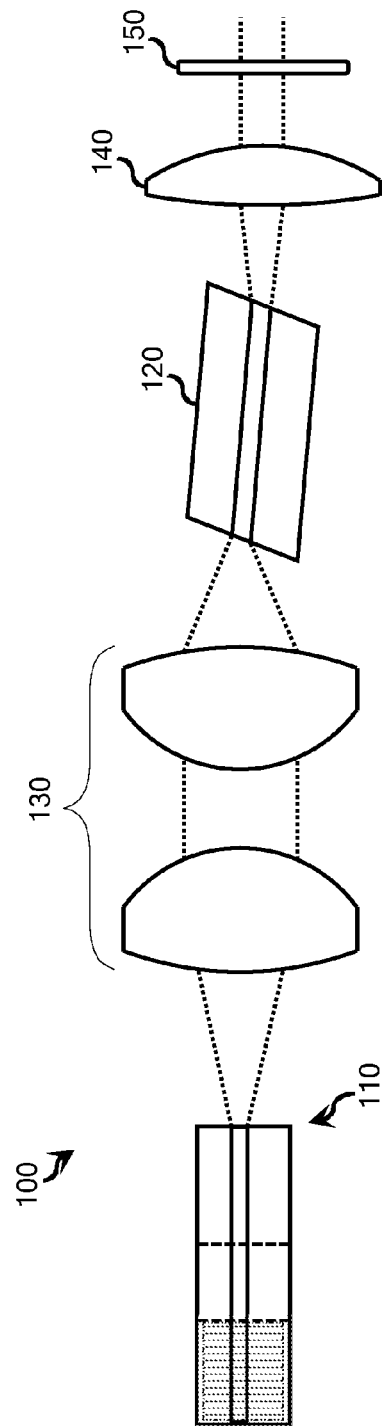
FIG. 6 is a generalized schematic illustration of a frequency-converted laser source incorporating a DBR laser diode.

Referring initially to FIGS. 1 and 2, a semiconductor laser 10 is illustrated comprising a laser chip 20 mounted on a carrier substrate 30. FIG. 1 illustrates a plan view of a metallized surface of the laser chip 20, while FIG. 2 is a schematic illustration of a portion of the metallized surface 22, a portion of the underlying crystallographic structure of the laser chip 20, and a portion of the carrier substrate 30. In FIG. 2, the scale of the crystal lattice has been exaggerated for illustrative purposes.

The laser chip 20 may be any conventional or yet-to-be developed semiconductor laser such as, for example, a distributed Bragg reflector (DBR) laser, which comprises a gain section 12, a phase control section 14, and a wavelength selective section 16. In any case, the laser chip 20 will comprise one or more of these types of crystallographic functional regions and a waveguide 25 extending along a longitudinal optical axis of propagation of the laser chip 20 through the crystallographic functional regions, 12, 14, 16.

As is illustrated in FIGS. 1 and 2, the metallized surface 22 of the laser chip 20, which comprises metallic and non-metallic portions, comprises a metallization pattern 24 formed over the crystallographic functional regions 12, 14, 16 of the laser chip 20. The metallization pattern 24 extends substantially parallel to the longitudinal optical axis of the laser chip 20, as defined by the waveguide 25. The crystallographic functional regions 12, 14, 16, which may be fabricated from any conventional or yet-to-be developed semiconductor suitable for laser applications, are characterized by a lattice structure comprising a plurality of lattice planes $L_1$, $L_2$, $L_i$, $L_j$, . . . that intersect the metallized surface 22 of the laser chip 20.

Typical laser diode metallization patterns will comprise a plurality of contact pads, which provide areas for bond wires, electrical connections, etc. Typical laser chips will require many different types of electrical connections, resulting in many separated metallization pads. These metallization pads can, for example, be made of 5-um thick gold on top of a SiN layer. Boundaries between two adjacent contact pads often run parallel to one of the primary lattice planes of the laser chip, e.g., crystal direction <011>. The present inventors have recognized a relatively large rate of chip fracture in these types of laser chips, typically after the laser chip has been mounted on a carrier and then treated at either low or high temperatures.

Chip fractures can degrade the characteristics of a laser diode drastically. More specifically, the present inventors have recognized that the optical spectrum of the laser can be more likely to become multimode, and jump from one wavelength to another wavelength randomly. In addition, laser output power can decrease more rapidly in a fractured laser chip. The present inventors have recognized that chip fractures can be caused by stress introduced by mounting a laser chip on a carrier and sequentially subjecting the chip-on-hybrid (COH) package to extreme temperatures. Finite element modeling and analysis of a 1060 nm laser chip package was conducted and revealed that mismatches in the respective coefficients of thermal expansion of the various package components causes thermo-mechanical stresses on the surface of the laser chip. Typical laser chips, like GaAs-based semiconductors, are relatively brittle and there is a high probability of chip cracking in the gap etch regions between the various functional regions of the laser chip.

The present disclosure introduces new metallization patterns for reducing or eliminating the aforementioned chip fracturing problem. Generally, features of the new patterns include, but are not limited to, slanted wire bond pads, 45 degree and 135 degree pad corners instead of 90-degree pad corners, and the provision of a continuous metallized bar, strip, or other portion 28 extending across the substantial entirety of the gain and phase control sections of the laser chip to enhance strength.

In the illustrated embodiment, the laser chip 20 comprises longitudinally adjacent contact pads P1-P5 that form longitudinally adjacent pairs of contact pads, i.e., (P1, P2), (P2, P3), (P3, P4), and (P4, P5). To enhance the fracture resistance of this type of metallization pattern, opposing edges of the longitudinally adjacent pairs of contact pads P1-P5 are oriented to extend across a plurality of the lattice planes $L_1$, $L_2$, $L_i$, $L_j$, . . . that intersect the metallized surface 22 of the laser chip 20. In this manner, more energy would be required for a crack to propagate through the thickness of the laser chip because the pad edges are not aligned with any particular lattice plane. In addition, it is contemplated that the contact pads can be configured to occupy a majority of the metallization pattern and to form an intervening gap a that extends across a plurality of the lattice planes that intersect the metallized surface of the laser chip.

Referring again to FIGS. 1 and 2, it is noted that typical metallization patterns will further comprise a plurality of conductive traces 26 that may be oriented substantially parallel to the lattice planes $L_1$, $L_2$, $L_i$, $L_j$, . . . . In some cases, these conductive traces and other types of conducting portions of the metallization pattern may run along particular crystalline plans of the device because the most problematic crack lines are often parallel to and away from the short edges of the chip. Similarly, the pad edges near the chip edges and along the long direction of the chip can also run along the crystalline planes without significant risk of cracking. Nevertheless, the influence of these conductive traces on the fracture resistance of the laser chip can be mitigated by ensuring that they do not dominate the surface area of the metallization pattern. Similarly, it is noted that additional edges of the longitudinally adjacent pairs of contact pads P1-P5 may be oriented substantially parallel to the lattice planes $L_1$, $L_2$, $L_i$, $L_j$, . . . . To mitigate the influence of these additional edges on the fracture resistance of the laser chip, the metallization pattern can be designed to ensure that the additional edges are dominated in the metallization pattern by the opposing edges, which extend across the lattice planes $L_1$, $L_2$, $L_i$, $L_j$, . . . . Typically, the lattice structure of the laser chip will be orthogonally aligned relative to the optical axis of propagation but it is contemplated that the concepts of the present invention may be applied to lattice structures that are angularly misaligned relative to the optical axis of propagation.

As is noted above, the crystallographic functional regions of the laser chip may comprise a gain region 12, a phase control region 14, a wavelength selective region 16, or combinations thereof. In particular embodiments, the adjacent pairs of contact pads will lie in the wavelength selective region 16 of the laser chip but it is also contemplated that adjacent pairs of contact pads may lie in one of the crystallographic functional regions of the laser chip, at an interface of adjacent crystallographic functional regions of the laser chip, or both.

It is noted that recitations herein of a component of the present disclosure being "configured" in a particular way, to embody a particular property, or to function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the term "approximately" is utilized herein to represent the inherent degree of uncertainty that may be attributed to any quantitative comparison, value, measurement, or other representation. The term "approximately" is also utilized herein to represent the degree by which a quantitative representation may vary from a stated reference without resulting in a change in the basic function of the subject matter at issue.

Having described the subject matter of the present disclosure in detail and by reference to specific embodiments thereof, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

The invention claimed is:

1. A semiconductor laser comprising a laser chip mounted on a carrier substrate, wherein:
    the laser chip comprises one or more crystallographic functional regions and a waveguide extending along a longitudinal optical axis of propagation through the crystallographic functional regions of the laser chip;
    the laser chip further comprises a metallized surface comprising a metallization pattern formed over the crystallographic functional regions of the laser chip and extending substantially parallel to the longitudinal optical axis of the laser chip;
    the crystallographic functional regions of the laser chip are characterized by a lattice structure comprising a plurality of lattice planes that intersect the metallized surface of the laser chip;
    the metallization pattern comprises a plurality of longitudinally adjacent contact pads forming longitudinally adjacent pairs of contact pads; and
    opposing edges of the longitudinally adjacent pairs of contact pads face one another and are oriented to extend in a direction substantially non-parallel to the longitudinal optical axis and substantially non-orthogonal to the longitudinal optical axis and across a plurality of the lattice planes that intersect the metallized surface of the laser chip.

2. The semiconductor laser as claimed in claim 1 wherein the contact pads of the metallization pattern occupy a majority of the metallization pattern.

3. The semiconductor laser as claimed in claim 1 wherein the metallization pattern further comprises a plurality of conductive traces that are oriented substantially parallel to the lattice planes that intersect the metallized surface of the laser chip.

4. The semiconductor laser as claimed in claim 1 wherein:
    additional edges of the longitudinally adjacent pairs of contact pads are oriented substantially parallel to the lattice planes that intersect the metallized surface of the laser chip; and
    the additional edges oriented substantially parallel to the lattice planes are dominated in the metallization pattern by the opposing edges extending across the lattice planes.

5. The semiconductor laser as claimed in claim 1 wherein the contact pads of the metallization pattern are dominated by pad corners defining corner angles that are substantially greater or substantially less than 90°.

6. The semiconductor laser as claimed in claim 1 wherein the metallized surface of the laser chip comprises metallic and non-metallic portions.

7. The semiconductor laser as claimed in claim 1 wherein the crystallographic functional regions of the laser chip comprise a gain region, a phase control region, a wavelength selective region, or combinations thereof.

8. The semiconductor laser as claimed in claim 7 wherein the adjacent pairs of contact pads lie in the wavelength selective region of the laser chip.

9. The semiconductor laser as claimed in claim 7 wherein the adjacent pairs of contact pads lie in one of the crystallographic functional regions of the laser chip, at an interface of adjacent crystallographic functional regions of the laser chip, or both.

10. The semiconductor laser as claimed in claim 9 wherein the metallization pattern in remaining crystallographic functional regions of the laser chip is dominated by a continuous metallized portion extending across a substantial entirety of the remaining functional region.

11. The semiconductor laser as claimed in claim 1 wherein the lattice structure of the laser chip is orthogonally aligned relative to the optical axis of propagation.

12. The semiconductor laser as claimed in claim 1 wherein the lattice structure of the laser chip is angularly misaligned relative to the optical axis of propagation.

13. The semiconductor laser as claimed in claim 1 wherein the laser chip comprises an infrared or near-infrared semiconductor laser.

14. The semiconductor laser as claimed in claim 1 wherein the laser chip comprises a distributed feedback (DFB) laser, a distributed Bragg reflector (DBR) laser, or a Fabry-Perot laser.

15. The semiconductor laser as claimed in claim 1 wherein the semiconductor laser is coupled to a wavelength conversion device in a frequency-converted laser source.

16. The semiconductor laser as claimed in claim 15 wherein the frequency-converted laser source forms a component of a multi-color laser projector.

17. A semiconductor laser comprising a laser chip mounted on a carrier substrate, wherein:
    the laser chip comprises one or more crystallographic functional regions and a waveguide extending along a longitudinal optical axis of propagation through the crystallographic functional regions of the laser chip;
    the laser chip further comprises a metallized surface comprising a metallization pattern formed over the crystallographic functional regions of the laser chip and extending substantially parallel to the longitudinal optical axis of the laser chip; the crystallographic functional regions of the laser chip are characterized by a lattice structure comprising a plurality of lattice planes that intersect the metallized surface of the laser chip;

the metallization pattern on the metallized surface of the laser chip comprises a plurality of contact pads; and the contact pads occupy a majority of the metallization pattern and an intervening gap between adjacent contact pads extends in a direction substantially non-parallel to the longitudinal optical axis and substantially non-orthogonal to the longitudinal optical axis and across a plurality of the lattice planes that intersect the metallized surface of the laser chip, wherein opposing edges of the adjacent contact pads face one another and define the intervening gap.

18. A semiconductor laser as claimed in claim 1 wherein the opposing edges of the adjacent contact pads define an intervening gap having a width and a length, wherein the opposing edges extend along at least a portion of the length of the intervening gap.

19. A semiconductor laser as claimed in claim 17 wherein the intervening gap has a width and a length, wherein the opposing edges extend along at least a portion of the length of the intervening gap.

20. A semiconductor laser as claimed in claim 1 wherein the opposing edges include a first edge of a first longitudinally adjacent contact pad and a second edge of a second longitudinally adjacent contact pad, wherein the first edge includes a first segment, wherein the second edge includes a second segment, and wherein the first edge faces the second edge along at least one of the first segment and the second segment.

* * * * *